United States Patent
Tsuyuno et al.

(10) Patent No.: US 10,177,084 B2
(45) Date of Patent: Jan. 8, 2019

(54) SEMICONDUCTOR MODULE AND METHOD OF MANUFACTURING SEMICONDUCTOR MODULE

(71) Applicant: HITACHI, LTD., Tokyo (JP)

(72) Inventors: Nobutake Tsuyuno, Tokyo (JP); Eiichi Ide, Tokyo (JP)

(73) Assignee: HITACHI, LTD., Tokyo (JP)

(*) Notice: Subject to any disclaimer, the term of this patent is extended or adjusted under 35 U.S.C. 154(b) by 11 days.

(21) Appl. No.: 15/534,686

(22) PCT Filed: Nov. 6, 2015

(86) PCT No.: PCT/JP2015/081247
§ 371 (c)(1),
(2) Date: Jun. 9, 2017

(87) PCT Pub. No.: WO2016/092994
PCT Pub. Date: Jun. 16, 2016

(65) Prior Publication Data
US 2017/0338176 A1    Nov. 23, 2017

(30) Foreign Application Priority Data
Dec. 12, 2014 (JP) .................. 2014-251516

(51) Int. Cl.
*H01L 23/498* (2006.01)
*H01L 23/48* (2006.01)
(Continued)

(52) U.S. Cl.
CPC ........ *H01L 23/49838* (2013.01); *H01L 23/48* (2013.01); *H01L 24/48* (2013.01);
(Continued)

(58) Field of Classification Search
None
See application file for complete search history.

(56) References Cited

U.S. PATENT DOCUMENTS

2003/0143780 A1* 7/2003 Shirasaka ......... B29C 45/14073
438/125
2005/0230816 A1* 10/2005 Kurauchi ............ H01L 23/3107
257/706
(Continued)

FOREIGN PATENT DOCUMENTS

JP    H05-109805 A    4/1993
JP    H06-104305 A    4/1994
(Continued)

OTHER PUBLICATIONS

International Search Report for WO 2016/092994 A1, dated Jan. 19, 2016.

*Primary Examiner* — Joseph C Nicely
*Assistant Examiner* — Lamont Koo
(74) *Attorney, Agent, or Firm* — Volpe and Koenig, P.C.

(57) ABSTRACT

An object of the invention is to manufacture a semiconductor module small. A metal wire (212) connecting a control electrode (101) and a control terminal (21) rises to form a first angle (θ1) from the control electrode (101) toward a first conductive portion (202), gradually goes in substantially parallel to the first conductive portion (202) as the metal wire approaches the first conductive portion (202), and is connected to the control terminal (21) to form a second angle (θ2) smaller than the first angle (θ1).

6 Claims, 11 Drawing Sheets

(51) Int. Cl.
*H01L 25/07* (2006.01)
*H01L 25/18* (2006.01)
*H01L 23/00* (2006.01)
*H01L 29/739* (2006.01)

(52) U.S. Cl.
CPC .............. *H01L 24/73* (2013.01); *H01L 25/07* (2013.01); *H01L 25/18* (2013.01); *H01L 29/7395* (2013.01); *H01L 2224/05552* (2013.01); *H01L 2224/05554* (2013.01); *H01L 2224/0603* (2013.01); *H01L 2224/48091* (2013.01); *H01L 2224/48247* (2013.01); *H01L 2224/73265* (2013.01); *H01L 2924/181* (2013.01)

(56) References Cited

U.S. PATENT DOCUMENTS

2007/0145540 A1*  6/2007  Mochida ............. H01L 23/4334
                                                                      257/659
2011/0037166 A1   2/2011  Ikeda et al.

FOREIGN PATENT DOCUMENTS

| JP | H07-094544 | A | 4/1995 |
| JP | 2003-347345 | A | 12/2003 |
| JP | 2007-173680 | A | 7/2007 |
| JP | 2014-060410 | A | 4/2014 |
| WO | 2009/125779 | A1 | 10/2009 |

\* cited by examiner

FIG. 7
(a)
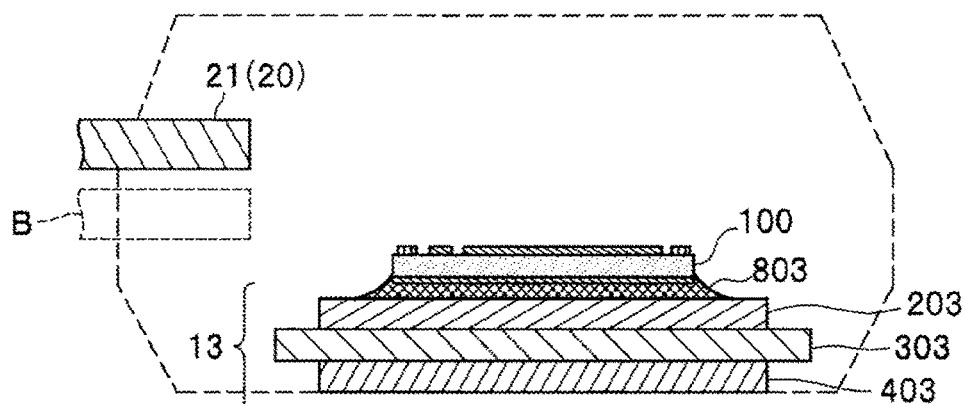
(b)
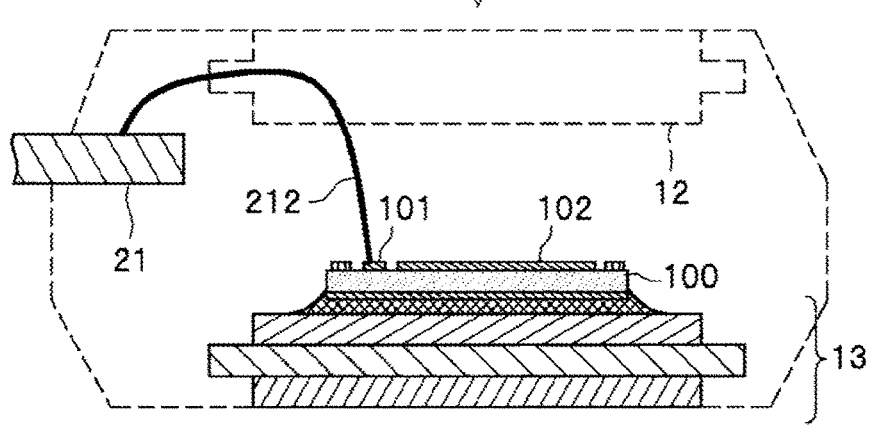
(c)
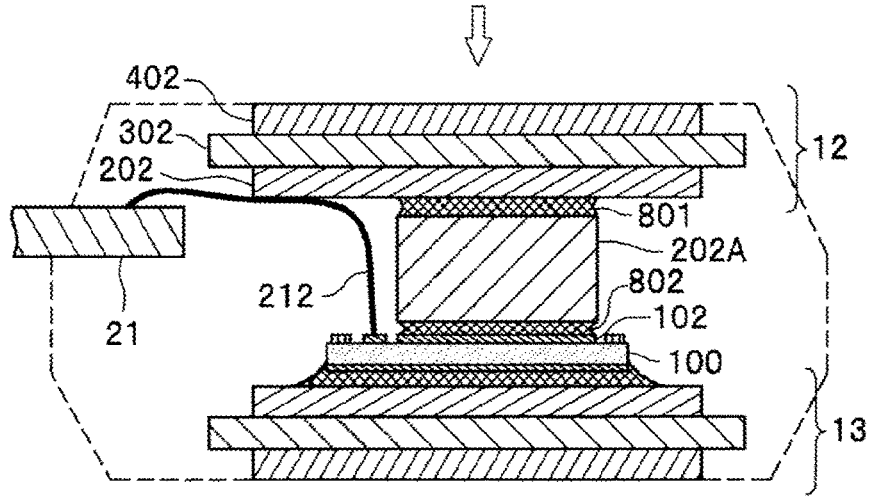

FIG. 11
(a)
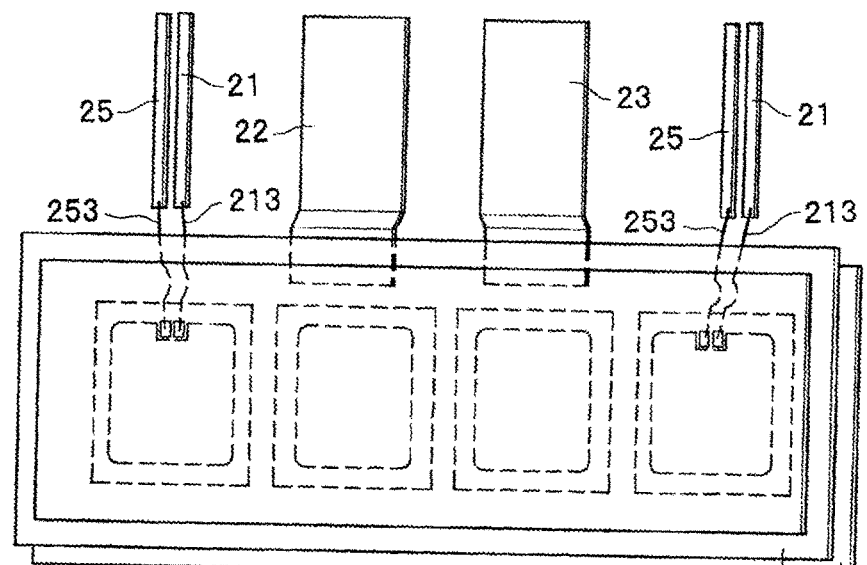
(b)
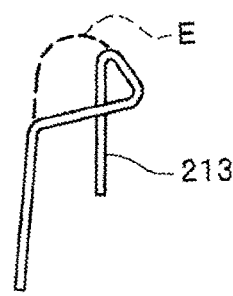
(c)
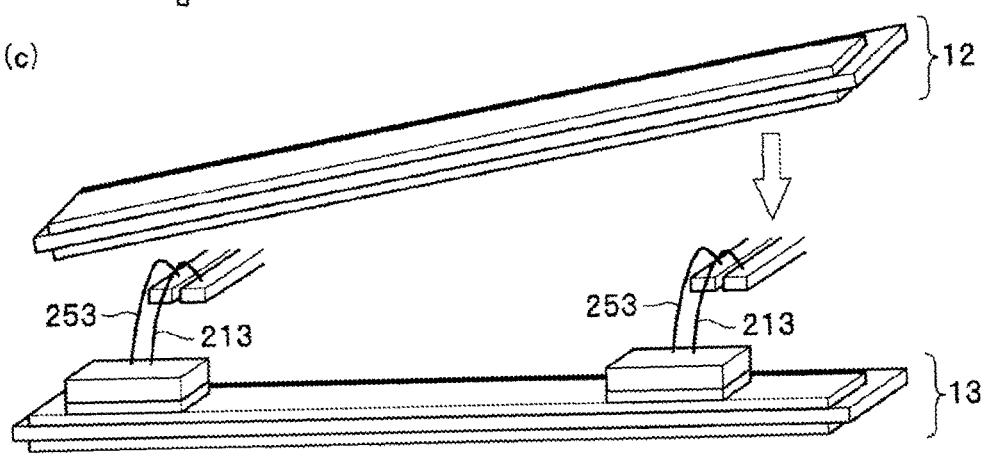

SEMICONDUCTOR MODULE AND METHOD OF MANUFACTURING SEMICONDUCTOR MODULE

TECHNICAL FIELD

The present invention relates to a semiconductor module and a method of manufacturing the semiconductor module.

BACKGROUND ART

As a related art of a semiconductor module used in a power conversion device, PTL 1 discloses "Provided is a semiconductor device which can efficiently radiate heat from main surfaces in the vertical direction of the semiconductor device with a semiconductor element mounted thereon" and "In a semiconductor device 4, a metal foil 10ac of an insulating substrate 10A is disposed up to the vicinity of the end of an insulating plate 10aa (Portion C in the drawing). An insulating plate 10ga is provided separately, a control terminal 10g is connected to the upper surface side of the insulating plate 10ga, and a metal foil 10gb is connected to the lower surface side of the insulating plate 10ga" in the abstract.

CITATION LIST

Patent Literature

PTL 1: JP 2014-60410 A

SUMMARY OF INVENTION

Technical Problem

In recent years, a potential difference between the members in the semiconductor module becomes large as the semiconductor module is increased in voltage. When a plurality of members different in potential from each other are disposed, a dimension is determined in consideration of a variation caused at the time of manufacturing while securing an insulation distance as long as a dielectric breakdown can be prevented. Therefore, there is a problem in increasing the size of the semiconductor module. The invention has been made in view of the above problems, and an object thereof is to provide a semiconductor module and a method of manufacturing the semiconductor module which can be manufactured small.

Solution to Problem

According to the invention to solve the above problem, a metal wire connecting a control electrode and a control terminal rises to form a first angle from the control electrode toward a first conductive portion, gradually goes in substantially parallel to the first conductive portion as the metal wire approaches the first conductive portion, and is connected to the control terminal to form a second angle smaller than the first angle.

Advantageous Effects of Invention

According to this invention, it is possible to manufacture a semiconductor module small.

BRIEF DESCRIPTION OF DRAWINGS

FIG. 7 is a diagram illustrating a manufacturing process of the power module.

FIG. 11 is a diagram illustrating a configuration of a power module in a modification of the embodiment.

DESCRIPTION OF EMBODIMENTS

Configuration of Embodiment

<Overall Configuration>

Figure 1:
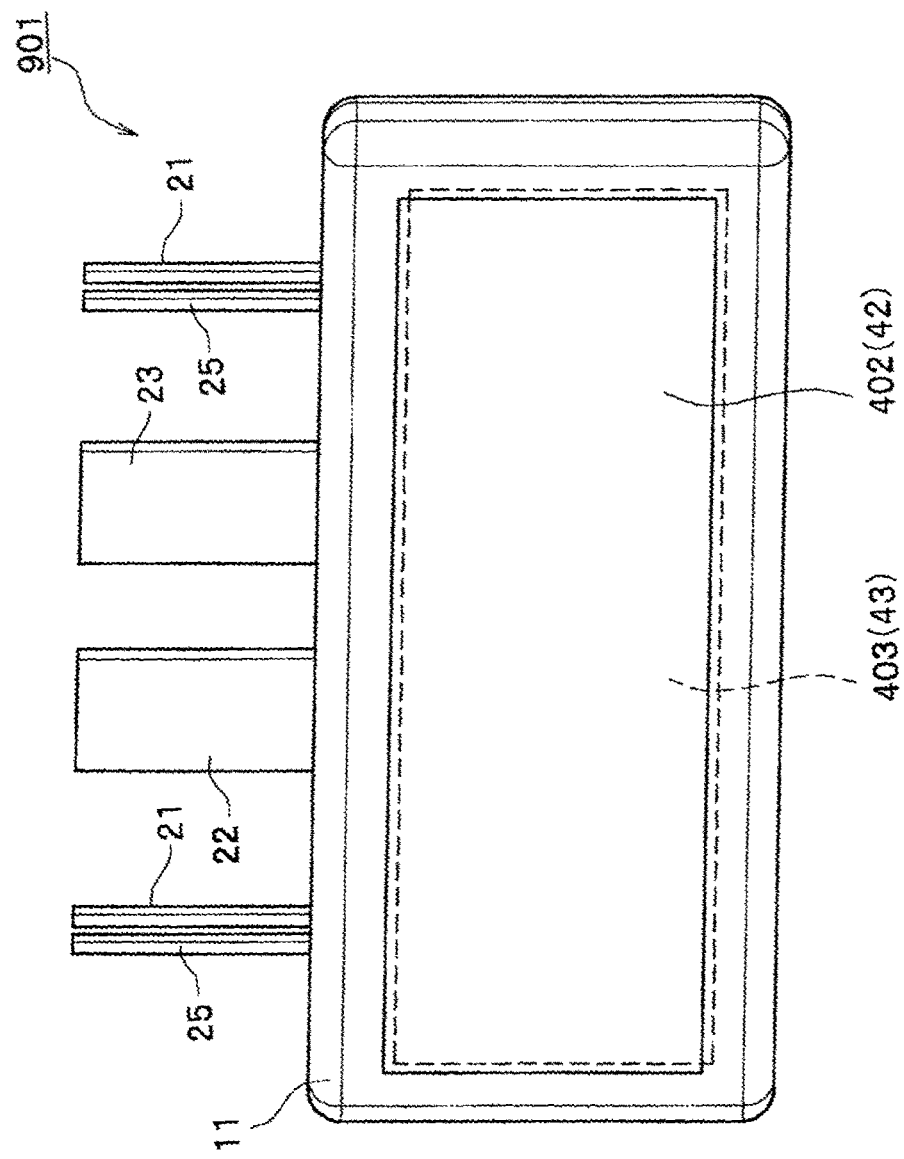
FIG. 1 is a perspective view of a power module according to an embodiment of the invention.

Next, a configuration of a power module according to an embodiment of the invention will be described. FIG. 1 is a perspective view of a power module 901 according to this embodiment. The power module 901 has a substantially rectangular plate shape, and provided with heat radiating portions 402 and 403 of a rectangular thin plate shape in two surfaces which are disposed in parallel to face each other. The surfaces on the outside of the heat radiating portions 402 and 403 (exposed surface) are called heat radiating surfaces 42 and 43. A plurality of plate terminals (that is, an emitter terminal 22, a collector terminal 23, a pair of gate terminals 21, and a pair of sense emitter terminals 25) protrude from one of the side surfaces of the power module 901, interposed between the heat radiating surfaces 42 and 43. A sealing agent fills portions except the heat radiating surfaces 42 and 43 and the respective terminals so as to form a sealing portion 11.

Figure 2:
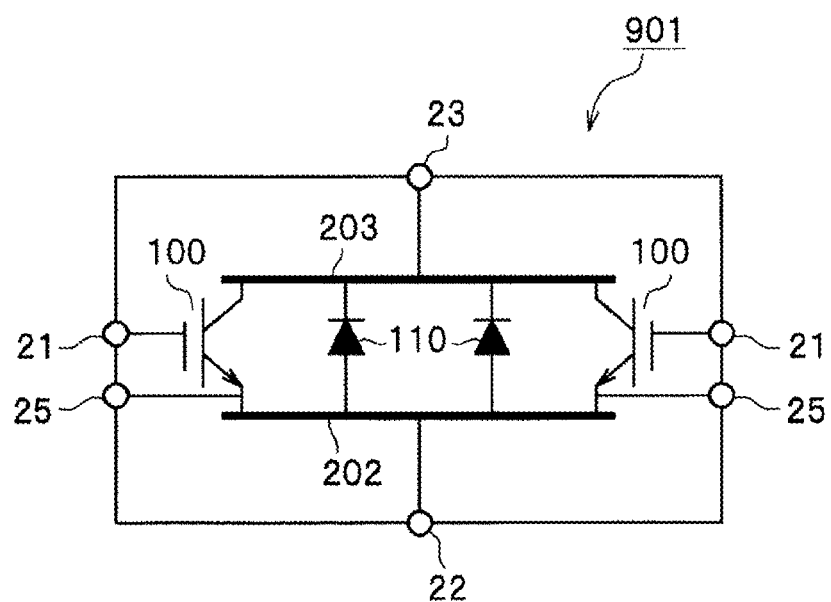
FIG. 2 is a circuit diagram of the power module.

Next, a circuit configuration of the power module 901 is illustrated in FIG. 2. The power module 901 includes a pair of insulated gate bipolar transistor (IGBT) chips 100 equipped with the sense emitter, a collector circuit portion 203 which mutually connects collector electrodes of the IGBT chips 100, an emitter circuit portion 202 which mutually connects emitter electrodes of the IGBT chips 100, and a pair of freewheel diode chips 110 which are connected to the emitter circuit portion 202 and the collector circuit portion 203.

The emitter circuit portion 202 is connected to the emitter terminal 22, and the collector circuit portion 203 is connected to the collector terminal 23. In addition, a gate electrode and a sense emitter electrode of each of the pair of IGBT chips 100 are connected to the gate terminal 21 and the sense emitter terminal 25 respectively. As is well known, the IGBT chip 100 controls the ON/OFF state of the terminals 22 and 23 by a voltage applied to the gate terminal 21.

Figure 3:
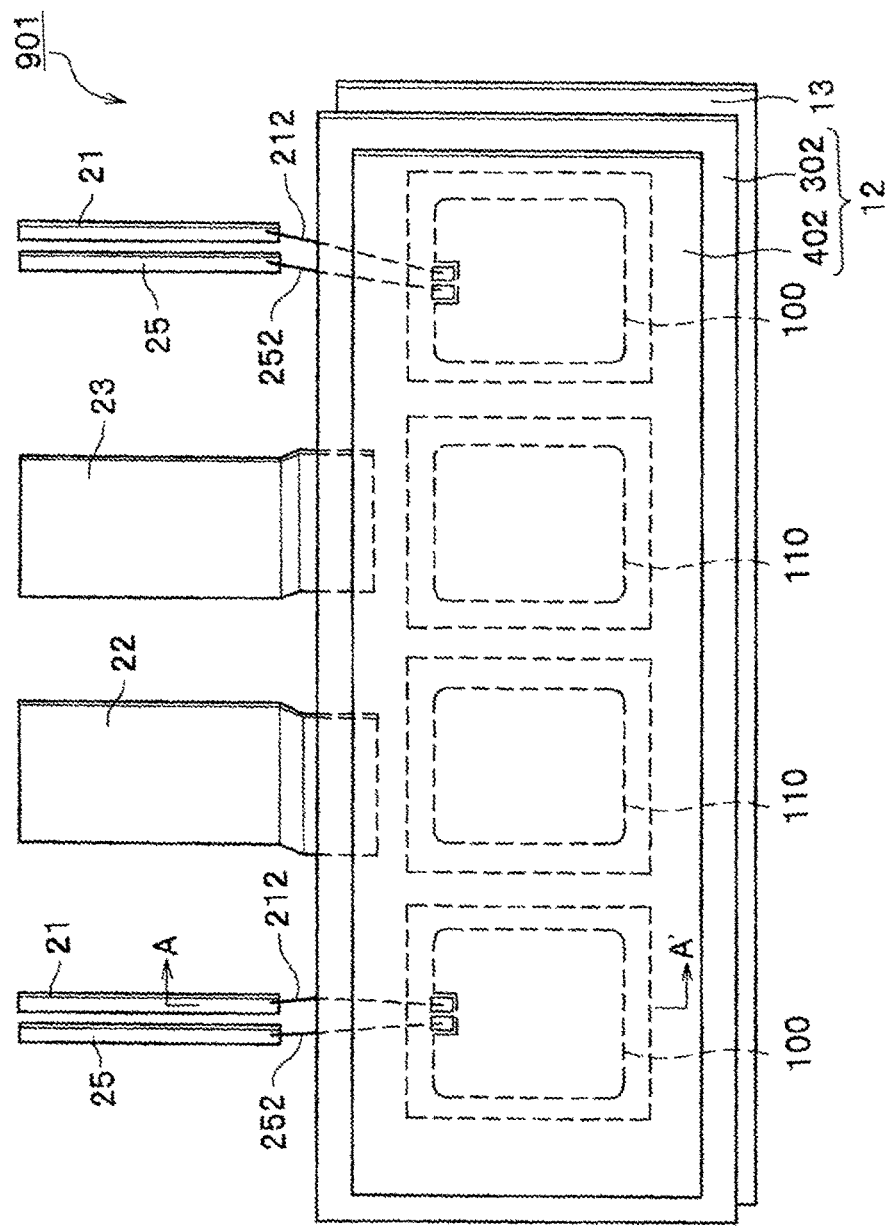
FIG. 3 is a perspective view of the power module from which a sealing portion is removed.

Next, a perspective view of the power module 901 in a state where the sealing portion 11 in FIG. 1 is removed is illustrated in FIG. 3. The heat radiating portion 402 illustrated in FIG. 1 occupies a part of a ceramic substrate 12 on the emitter electrode side. In other words, the ceramic substrate 12 includes a ceramic insulating layer 302 of the rectangular plate shape, and the heat radiating portion 402 of the rectangular plate shape which is formed in the outer surface and slightly smaller than the ceramic insulating layer 302. In addition, a ceramic substrate 13 on the collector electrode side is disposed in the rear surface of the power module 901 to face the ceramic substrate 12 on the emitter electrode side. Then, the pair of IGBT chips 100 and the pair of diode chips 110 are interposed between the ceramic substrates 12 and 13. The gate terminal 21 and the sense emitter terminal 25 are connected to the IGBT chip 100 through metal wires 212 and 252. In addition, the emitter terminal 22 and the collector terminal 23 are connected to places facing the diode chips 110.

Figure 4:
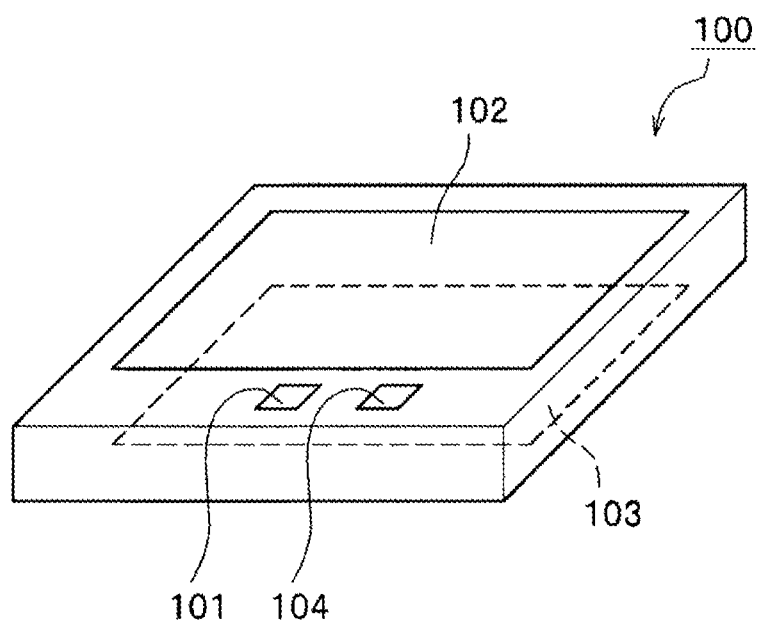
FIG. 4 is a perspective view of an IGBT chip.

Next, a perspective view of the IGBT chip 100 is illustrated in FIG. 4. The IGBT chip 100 is formed almost in the rectangular plate shape, and includes an emitter electrode 102 which is formed as a main electrode in the upper surface and a collector electrode 103 which is formed as a main electrode in the lower surface. In addition, a gate electrode 101 and a sense emitter electrode 104 are formed as control electrodes in alignment with the emitter electrode 102. The shape of the diode chip 110 is formed in the rectangular plate shape having almost the same dimension as that of the IGBT chip 100 while not illustrated in the drawing, and includes an anode electrode in the upper surface (a position corresponding to the emitter electrode 102) and a cathode electrode in the lower surface.

Figure 5:
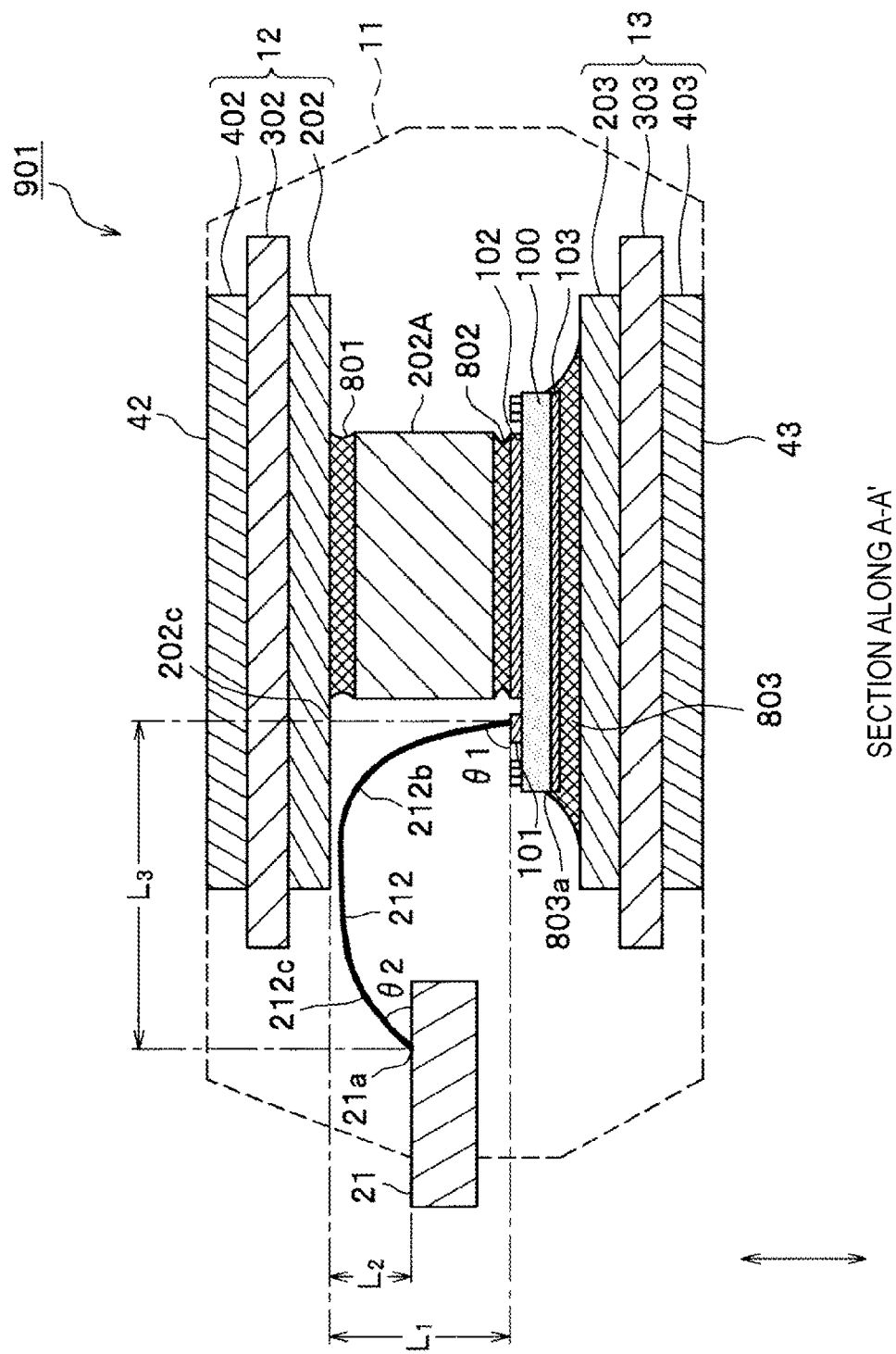
FIG. 5 is a cross-sectional view taken along a line A-A' in FIG. 3.

Next, a cross section taken along a line A-A' in FIG. 3 is illustrated in FIG. 5. In FIG. 5, the ceramic substrate 13 on the collector electrode side includes a ceramic insulating layer 303, the heat radiating portion 403 which is bonded to the outer surface, and the collector circuit portion 203 which is bonded to the inner surface. Then, the collector electrode 103 of the IGBT chip 100 is electrically bonded to the collector circuit portion 203 through a metal bonding portion 803. In addition, the collector circuit portion 203 and the heat radiating portion 403 are electrically insulated by interposing the ceramic insulating layer 303 therebetween.

In addition, the ceramic substrate 12 on the emitter electrode side includes the ceramic insulating layer 302, the heat radiating portion 402 which is bonded to the outer surface, and the emitter circuit portion 202 which is bonded to the inner surface. A conductor block 202A which is a metal block of a cuboid shape is inserted between the emitter electrode 102 and the emitter circuit portion 202 of the IGBT chip 100. The conductor block 202A is bonded to the emitter circuit portion 202 and the emitter electrode 102 through metal bonding portions 801 and 802, so that the emitter electrode 102 and the emitter circuit portion 202 are electrically connected. In addition, the emitter circuit portion 202 and the heat radiating portion 402 are electrically insulated by interposing the ceramic insulating layer 302 therebetween.

Figure 6:
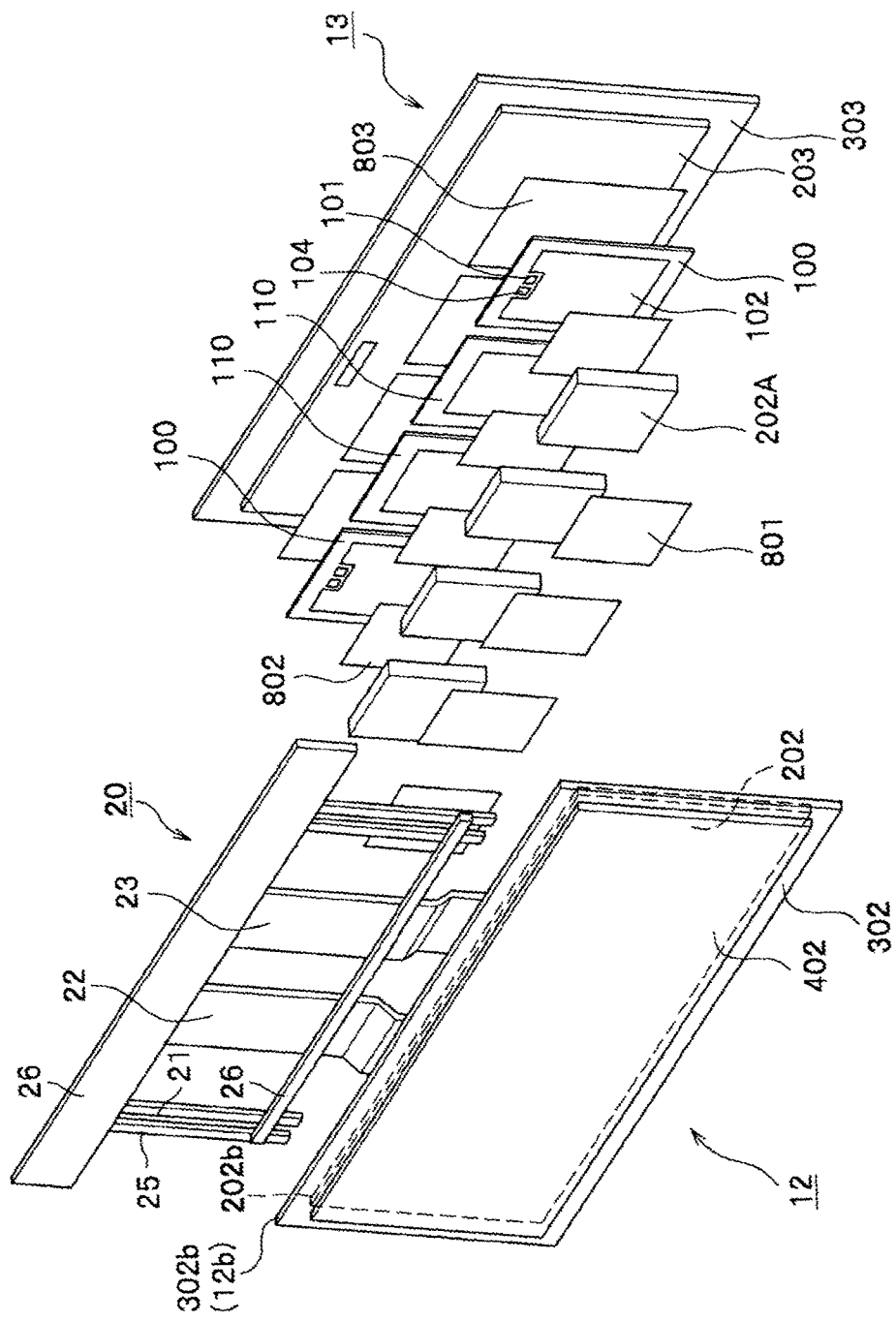
FIG. 6 is an exploded perspective view of the power module in a state where the sealing portion is removed.

Next, an exploded perspective view of the power module 901 in a state where the sealing portion 11 is removed is illustrated in FIG. 6. In this case, the state of the terminals 21, 22, 23, and 25 in FIG. 6 is different from those of FIGS. 1, 3, and 5. In other words, the terminals 21, 22, 23, and 25 in FIG. 6 are bonded to a runner 26, and a lead frame 20 is integrally formed. In other words, the respective terminals are held in an integrated state as the lead frame 20 in a manufacturing process of the power module 901. Finally, the respective terminals 21, 22, 23, and 25 are independently separated by cutting out the runner 26 so as to complete the power module 901.

In FIG. 6, the IGBT chip 100 and the diode chip 110 are disposed in parallel, and each bonded to the collector circuit portion 203 of the ceramic substrate 13 on the collector electrode side through the metal bonding portion 803. In addition, the IGBT chip 100 and the diode chip 110 are bonded to the emitter circuit portion 202 of the ceramic substrate 12 on the emitter electrode side sequentially through the metal bonding portion 802, the conductor block 202A, and the metal bonding portion 801. As described above, since the emitter circuit portion 202 and the ceramic insulating layer 302 both are formed in the rectangular plate shape, these ends (an end 202b of the emitter circuit portion and an end 302b of the ceramic insulating layer) in the exposed surface (the exposed surface of the lead frame 20) of the respective terminals come to have a straight shape together. Further, the ceramic insulating layer 302 among the components of the ceramic substrate 12 on the emitter electrode side protrudes to the outermost side in the exposed surface of the respective terminals. Therefore, the end 302b of the ceramic insulating layer also becomes an end 12b of the ceramic substrate 12.

Returning to FIG. 5, a voltage Vec between the emitter electrode 102 and the collector electrode 103 reaches a considerably high value (for example, 1.2 kV). A voltage Veg between the emitter electrode 102 and the gate electrode 101 is a value low by about several voltages. Therefore, a voltage Vgc between the gate electrode 101 and the collector electrode 103 becomes almost the same value (for example, 1.2 kV) as the voltage Vec.

In FIG. 5, the metal bonding portion 803 is closest to the metal wire 212 among the members having a collector potential. In particular, the highest point 803a of the rising portion of the peripheral edge is closest to the metal wire 212. Since the sealing portion 11 of the power module 901 is made of resin, there is a need to secure an insulation distance not to cause a dielectric breakdown between the metal bonding portion 803 (specifically the highest point 803a) and the metal wire 212 according to a dielectric property of the resin and the voltage Vgc. The insulation distance is adjusted by the height of the conductor block 202A. Hereinafter, the configurations of the respective portions in FIG. 5 will be described in more detail.

<Metal Wire 212>

In FIG. 5, the gate electrode 101 of the IGBT chip 100 is bonded to the gate terminal 21 through the metal wire 212. The metal wire 212 has movability in the vertical direction of the power module 901 in a state before the sealing portion 11 is formed. The metal wire 212 may be made of copper, aluminum, or gold. The cross section of the metal wire 212 is not limited to a circular shape, but may be an elliptical shape or a rectangular shape. In addition, the thickness of the metal wire in a direction of diameter or short-side may fall within a range of 10 μm to 300 μm.

The metal wire 212 steeply rises to form an angle θ1 from the gate electrode 101, approaches close to the emitter circuit portion 202 in the vicinity of the end of the IGBT chip 100, forms a smooth loop, and is connected to the gate terminal 21. A connection point 21a between the gate terminal 21 and the metal wire 212 is located on the upper portion from the gate electrode 101 of the IGBT chip 100, and on the lower portion from the emitter circuit portion 202. Then, the angle θ1 formed between the metal wire 212 and the IGBT chip 100 is larger than an angle θ2 formed between the metal wire 212 and the gate terminal 21.

Making an explanation on the shape of the metal wire 212 in more detail, the angle θ1 rises from the gate electrode 101 toward the heat radiating surface 42, and the angle formed with respect to the heat radiating surface 42 is slightly reduced as it goes near to the ceramic substrate 12 on the emitter electrode side. Then, there is a peak in which the curvature is maximized at a position 212b. Thereafter, the metal wire 212 approaches the gate terminal 21 while keeping almost parallel with the heat radiating surface 42, is bent to have the peak (extreme value) of the curvature again at a position 212c in the vicinity of the connection point 21a, and is connected to the gate terminal 21 to form the angle θ2 in the connection point 21a.

Herein, the metal wire 212 has a length exceeding "$L_1+\sqrt{(L_2^2+L_3^2)}$", where $L_1$ is a distance between the ceramic substrate 12 on the emitter electrode side and the gate electrode 101 in a direction perpendicular to the heat radiating surface 42, $L_2$ is a distance between the ceramic substrate 12 and the connection point 21a in the same direction, and $L_3$ is a distance between the gate electrode 101 and the connection point 21a in a direction parallel to the heat radiating surface 42. Specifically, the metal wire is lengthened by 2% or more with respect to "$L_1+\sqrt{(L_2^2+L_3^2)}$". Further, an interval between the metal wire 212 and the emitter circuit portion 202 becomes 100 μm or less in a place where both are closest to each other. A voltage between the metal wire 212 and the emitter circuit portion 202 is a value equal to the voltage Veg between the emitter electrode 102 and the gate electrode 101, or lower by about several voltages. Therefore, even when the interval of the two is equal to or less than 100 μm, it is possible to secure a sufficient insulation distance. Herein, the length of the metal wire 212 is determined by the shape of the metal wire 212, and a positional relation of the peripheral members of the metal wire such as the emitter circuit 202, the collector circuit 203, the conductor block 202A, and the gate electrode 101.

<Conductor Block 202A>

The conductor block 202A serves as a spacer to secure the insulation distance between the emitter circuit portion 202 and the collector circuit portion 203. The insulation distance is determined by a maximum voltage between two circuit portions 202 and 203 and an insulation property of the sealing portion 11. Since the potential of the metal wire 212 is close to the potential of the emitter circuit portion 202, the metal wire 212 is disposed close to the emitter circuit portion 202 as illustrated in FIG. 5, so that the conductor block 202A also has a function to secure the insulation distance between the metal wire 212 and the collector circuit portion 203.

In addition, the heat generated in the IGBT chip 100 is radiated to the outside through a path where the heat is transferred from the ceramic substrate 13 on the collector electrode side, and a path where the heat is transferred from the ceramic substrate 12 on the emitter electrode side. With this configuration, the IGBT chip 100 can be cooled down from both the heat radiating surfaces 42 and 43, and a cooling efficiency can be increased. Therefore, the conductor block 202A also has a function as a path through which the heat is transferred from the IGBT chip 100 to the ceramic substrate 12 on the emitter electrode side. Therefore, the conductor block 202A is configured not to have a gap.

The conductor block 202A is provided to have a width and a depth larger than the thickness (the length in the vertical direction of FIG. 5) to sustain itself at the time of the bonding process. Further, the thickness of the conductor block 202A is larger than a total thickness of the metal bonding portions 801 and 802 in order to make the inclination and the thickness less vary at the time of bonding. Furthermore, the width and the depth of the surface facing the emitter electrode 102 of the conductor block 202A are made smaller than those of the emitter electrode 102 in order to improve assembly performance.

In the conductor block 202A, copper, aluminum, molybdenum, tungsten, carbon having a high thermal conductivity, an alloy of these materials, or a composite is desirably selected in order to reduce electric resistance and thermal resistance. In addition, these materials may be combined, or an intermediate layer which has a low heat expansion rate with respect to copper and aluminum may be provided. Further, in this embodiment, the intermediate layer may be omitted.

<Ceramic Substrates 12 and 13>

The ceramic insulating layers 302 and 303 of the ceramic substrates 12 and 13 may be made using aluminum nitride, silicon nitride, and alumina having a high dielectric breakdown voltage may. In particular, aluminum nitride and silicon nitride having a high thermal conductivity are desirable. The thicknesses of the ceramic insulating layers 302 and 303 are desirably set within a range of 0.1 to 1.5 mm in correspondence with the insulation property necessary for the power module. In addition, the thicknesses of the ceramic insulating layers 302 and 303 are desirably set to be equal in front and rear surfaces in order to reduce deformation caused by thermal stress of the power module. In addition, the ceramic insulating layer may be formed in a matrix shape using resin, and may be formed in a sheet shape where a filler having a high thermal conductivity such as alumina, boron nitride, yttria, and aluminum nitride is mixed. However, in a case where the resin is used, there is a need to perform a mounting process after bonding the metal bonding portions 801 to 803 from the viewpoint of heat resistance.

In addition, the emitter circuit portion 202 and the collector circuit portion 203 are bonded to the emitter electrode 102 and the collector electrode 103 which are main electrodes of the IGBT chip 100. Therefore, it is desirable that copper, aluminum, or an alloy of these materials having a low electric resistance be used. In addition, since the ceramic insulating layers 302 and 303 have expansion coefficients lower than those of the two circuit portions 202 and 203, an intermediate layer made of molybdenum, tungsten, and carbon having a low thermal expansion and a high thermal conductivity, or a composite of these materials and copper or aluminum may be provided between the two circuit portions 202 and 203 and the ceramic insulating layers 302 and 303. Further, in this embodiment, the intermediate layer may be omitted. The thicknesses of the emitter circuit portion 202 and the collector circuit portion 203 are desirably set within a range of 0.2 to 2.0 mm in correspondence with the necessary current capacitance.

In the heat radiating portions 402 and 403, it is desirable that copper, aluminum, or an alloy of these materials having a high thermal conductivity be used. In addition, similarly to the above circuit portions 202 and 203, an intermediate layer made of molybdenum, tungsten, and carbon having a low thermal expansion and a high thermal conductivity, or a composite of these materials and copper or aluminum may be provided between the heat radiating portions 402 and 403 and the ceramic insulating layers 302 and 303. In this embodiment, the intermediate layer may be omitted.

The circuit portions 202 and 203 and the heat radiating portions 402 and 403 are bonded using, for example, a brazing material which can make strong bonding to the ceramic insulating layers 302 and 303. At this time, it is desirable that thermal stress obtained from a difference in thermal expansion rate and a Young's modulus of the circuit portions 202 and 203 and the heat radiating portions 402 and 403 be set to be equal by interposing the ceramic insulating layers 302 and 303. For example, when a material having the same composition is applied to the circuit portions 202 and 203 and the heat radiating portions 402 and 403, the shape may be set to have the substantially equal volume. In addition, it is desirable that a creeping distance with respect to the ceramic insulating layers 302 and 303 of the sealing portion 11 be set to be long by reducing one or both of the widths of the circuit portions 202 and 203 and the heat radiating portions 402 and 403 with respect to the width of the ceramic insulating layers 302 and 303. The circuit portions 202 and 203 may be manufactured to have a circuit pattern by etching after bonding the ceramic insulating layers 302 and 303, or the circuit pattern may be manufactured by punching before bonding.

<Sealing portion 11>

In the sealing portion 11, for example, there may be used a resin based on epoxy resin system, acrylic system, silicone system, bismaleimide-triazine system, cyanate ester system of novolac, polyfunctional, biphenyl, and phenol types having adhesiveness. In these resins, ceramic such as $SiO_2$, $Al_2O_3$, AlN, and BN and fillers such as gel and rubber are contained, and a thermal expansion coefficient is set to be close to those of the IGBT chip 100, the diode chip 110, and the circuit portions 202 and 203 to reduce a difference in the thermal expansion coefficient. With the use of these resins, the thermal stress to be generated as the temperature rises at the time of usage environment is significantly reduced. Therefore, it is possible to extend the life span of the power module. In a case where a material having a low heat expansion is used in the circuit portions 202 and 203, and a low thermal stress is achieved, silicone gel may also be used.

Before the sealing portion 11 is sealed using the above resin, the respective circuits, the terminals, the ceramic insulating layer, the heat radiating portion, the semiconductor chip, and the metal bonding portion are desirably subjected to a process of improving an adhesive strength with respect to the sealing portion 11. For example, a method of forming a coating film such as polyamide imide and polyimide may be employed.

<Metal Bonding Portions 801 to 803>

For example, a solder material, metal fine particles, or a low-temperature sintered bonding material mainly formed by metal oxide particles may be used in the metal bonding portions 801 to 803 which are used to bond the emitter electrode 102 and the collector electrode 103. In the solder material, a solder material mainly formed by tin, bismuth, zinc, and gold having a melting point higher than a curing temperature of the sealing portion 11 may be used. In the metal oxide particles, metal oxide which is reducible at a low temperature equal to that of the solder material such as AgO, $Ag_2O$, and CuO may be applied. In a case where AgO, $Ag_2O$, and CuO are used, the metal bonding portions 801 to 803 becomes a sintered silver layer or a sintered copper layer.

[Manufacturing Process]

Next, a manufacturing process of the power module 901 will be described with reference to FIGS. 7 to 9. First, as illustrated in FIG. 7(a), the IGBT chip 100 and the diode chip 110 (see FIG. 6) are bonded to the ceramic substrate 13 on the collector electrode side through the metal bonding portion 803. In addition, the collector terminal 23 (see FIG. 6) is bonded to the collector circuit portion 203. At this time, as illustrated in FIG. 6, the collector terminal 23 is integrally formed as the lead frame 20 through the runner 26 together with other terminals.

A positional relation between the lead frame 20 and the ceramic substrate 13 on the collector electrode side is determined by bonding the collector terminal 23 to the collector circuit portion 203, and the position of the lead frame 20 is disposed slightly upward from the original position. The position of the lead frame 20 is illustrated in FIG. 7 (a) by the position of the gate terminal 21 which is a part of the lead frame. In FIG. 7(a), the position indicated by a broken line B is the original position of the gate terminal 21, and the gate terminal 21 is disposed slightly upward from the position.

Next, as illustrated in FIG. 7 (b), the gate electrode 101 and the gate terminal 21 are connected by the metal wire 212. The procedure is the same as a normal wire/bonding procedure. However, a loop shape of the metal wire 212 is set to interfere in the mounting position of the ceramic substrate 12 on the emitter electrode side illustrated by the broken line. Further, the wiring of the metal wire 212 is performed before the ceramic substrate 12 on the emitter electrode side is bonded to the IGBT chip 100. This is because the ceramic substrate 12 on the emitter electrode side covers the gate electrode 101 when the ceramic substrate 12 is bonded to the IGBT chip 100, and thus the wire/bonding procedure is not possible.

Next, as illustrated in FIG. 7(c), the conductor block 202A is bonded to the emitter electrode 102 through the metal bonding portion 802. Further, the ceramic substrate 12 on the emitter electrode side is bonded to the conductor block 202A through the metal bonding portion 801. At this time, the metal wire 212 is pressured and deformed downward while abutting on the substrate 12. The emitter terminal 22 is bonded to the ceramic substrate 12 on the emitter electrode side.

Next, as illustrated in FIG. 8(a), the power module 901 is set in molds 150 and 160 for transfer molding. In FIG. 8(a), an insertion hole 162 as a groove for inserting the terminal contained in the lead frame 20 such as the gate terminal 21 is formed in the left end of the mold 160. Further, the gate terminal 21 is inserted in the insertion hole 162 illustrated in FIG. 8(a). Then, the gate terminal 21 and other terminals (not illustrated) are pressed downward by the mold 150. Herein, the position where the insertion hole 162 is formed corresponds to the position where each terminal is finally disposed. Therefore, the gate terminal 21 disposed at the previous position (indicated by a broken line C on the drawing) is pressed down by the mold 150, and disposed at a position illustrated in FIG. 8(a). The other terminals are also disposed in parallel to the gate terminal 21 by pressing down by the mold 150.

Since the metal wire 212 is formed of a material having a high plasticity, the connection point 21a faces downward while keeping a state deformed due to the contact with the ceramic substrate 12. Therefore, the deformation is made such that the layout position of the metal wire 212 is lowered down overall. In addition, an injection hole 164 as a groove for injecting a resin 11a at the time of transfer molding is formed in the right end of the mold 160, and a pressing portion 152 is provided in the mold 150 to press the resin 11a. The resin 11a is filled between the mold 150 and the mold 160 through the pressing portion 152 and the injection hole 164. When the resin 11a is thermally cured, the sealing portion 11 is formed.

When the molds 150 and 160 are removed through the process as described above, the external appearance is as illustrated in FIG. 8(b). In addition, the plan view is as illustrated in FIG. 9. When the runner 26 is cut from the lead frame 20 in FIG. 9, the terminals 21, 22, 23, and 25 become separate terminals, and the power module 901 illustrated in FIG. 1 is completed.

Comparative Example

Figure 10:
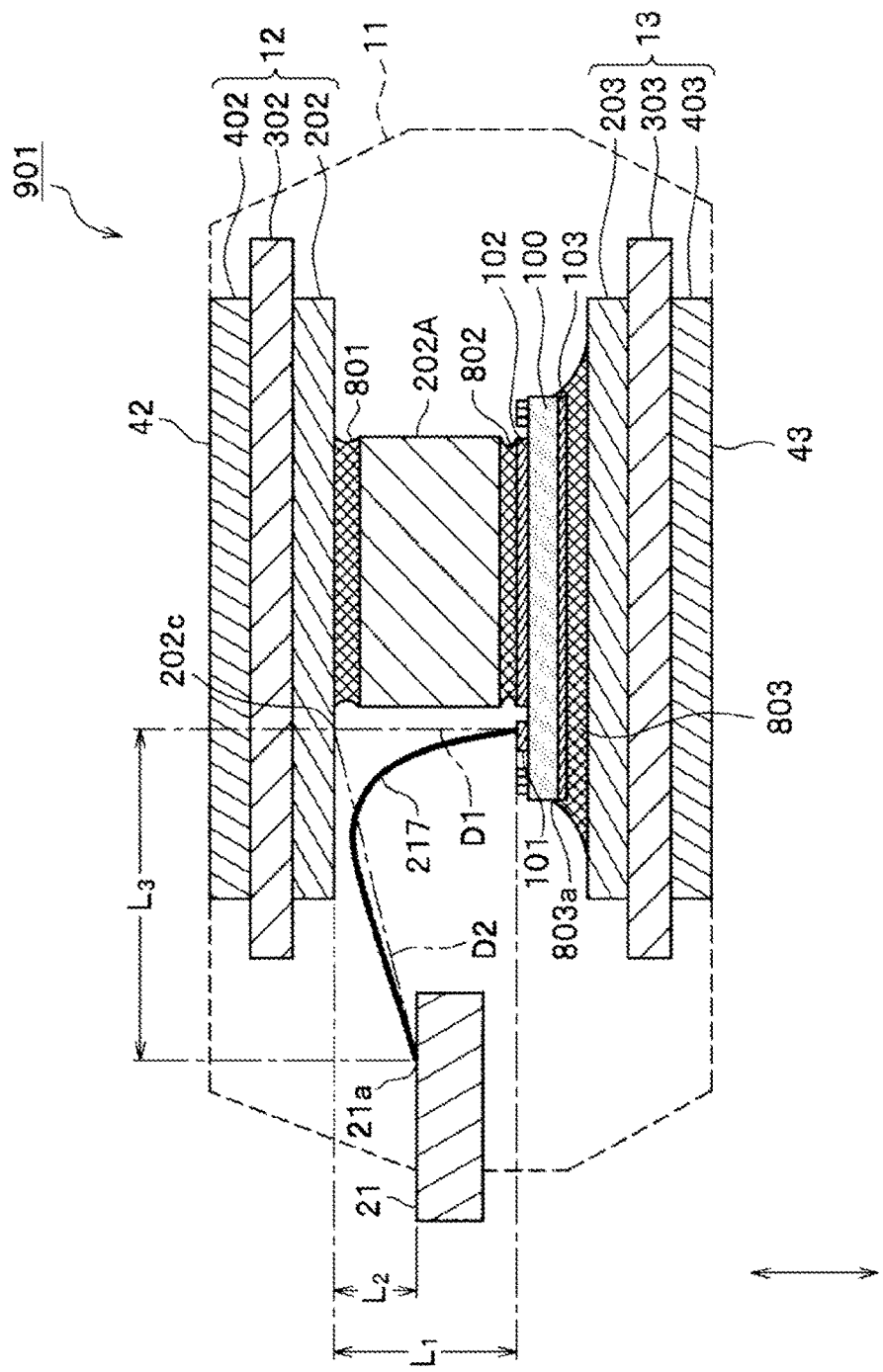
FIG. 10 is a diagram corresponding to a cross-sectional view taken along a line A-A' of a power module according to a comparative example.

Next, the configuration according to a comparative example will be described with reference to FIG. 10 in order to make the effect of this embodiment clear. In this comparative example, a metal wire 217 is applied in place of the metal wire 212. Since the metal wire 217 is bonded not to interfere in the layout place of the ceramic substrate 12 on the emitter electrode side from the beginning, the metal wire does not come into contact with the ceramic substrate 12 in the manufacturing process. In addition, the lead frame 20 containing the gate terminal 21 is determined to be disposed at the final position (see the drawing) from the beginning.

The loop shape of the metal wire 217 is a substantially triangular shape. The loop shape is determined by a route drawn by a bonding head (not illustrated) at the time of bonding. In other words, the bonding head discharges the metal wire 217 while drawing a route such as "<" with respect to the metal wire 217, so that the loop shape such as a substantially triangular shape is realized. Since inconvenience is caused when the loop shape is determined by such a method, it is difficult to accurately set the loop shape to a desired shape. The length which can be realized while the metal wire 217 does not interfere in the ceramic substrate 12 on the emitter electrode side is not possible to be made equal to or more than a total length of the line segments D1 and D2 on the drawing (that is, $L_1+\sqrt{(L_2^2+L_3^2)}$).

In addition, since there is a variation in the Young's modulus and the plasticity of the metal wire 217, the dimension and the shape of the metal wire 217 come to vary even when the bonding head is drawn on the same route. There is a need to set a sufficient margin with respect to the distance $L_1$ of the drawing in order for the metal wire 217 having variation in dimension and shape to satisfy two conditions, "No interference in the layout position of the ceramic substrate 12 on the emitter electrode side", and "Sufficient insulation distance with respect to the metal boding portion 803". In other words, in this comparative example, the conductor block 202A has to be lengthened in order to secure the distance $L_1$, and the power module is increased in size as much as the lengthened block compared to the embodiment.

Effect of Embodiment

As described above, the power module 901 of this embodiment includes a first substrate (12), a second substrate (13) which is disposed to face the first substrate (12), a first conductive portion (202) which is provided on a side facing the second substrate (13) in the first substrate (12), a second conductive portion (203) which is provided on a side facing the first substrate (12) in the second substrate (13), a first terminal (22) which is bonded to the first conductive portion (202), and disposed between the first substrate (12) and the second substrate (13), a second terminal (23) which is bonded to the second conductive portion (203) and disposed between the first substrate (12) and the second substrate (13), a control terminal (21) which is disposed between the first substrate (12) and the second substrate (13), a semiconductor chip (100) which includes a first electrode (102) and a control electrode (101) in one surface, and a second electrode (103) in a surface opposite to the surface, a metal wire (212) which is drawn in an arc to connect the control terminal (21) and the control electrode (101), and a conductor block (202A) which is disposed between the first conductive portion (202) and the second conductive portion (203).

The semiconductor chip (100) is configured such that the first electrode (102) is connected to the first conductive portion (202) of the first substrate (12) through the conductor block (202A), and the second electrode (103) is connected to the second conductive portion (203) of the second substrate (13). The metal wire (212) rises to form a first angle (θ1) from the control electrode (101) toward the first conductive portion (202), gradually goes in substantially parallel to the first conductive portion (202) as it approaches the first conductive portion (202), and is connected to the control terminal (21) to form a second angle (θ2) smaller than the first angle (θ1).

In addition, the metal wire (212) has a length exceeding "$L_1+\sqrt{(L_2^2+L_3^2)}$", where $L_1$ is a distance between the first substrate (12) and the control electrode (101) in a direction perpendicular to the first conductive portion (202), $L_2$ is a distance between the first substrate (12) and the connection point (21a) of the metal wire (212) in the control terminal (21) in a direction perpendicular to the first conductive portion (202), and $L_3$ is a distance between the control electrode (101) and the connection point (21a) in a direction in parallel to the first conductive portion (202). With the configuration described above, this embodiment obtains the following effects.

(1) According to this embodiment, the shape and the length of the metal wire 212 are set as described above, so that it is possible to form the power module 901 to be thin (small) while securing a sufficient insulation distance between the metal wire 212 and the member (such as the metal bonding portion 803) to be at the collector potential.

Figure 8:
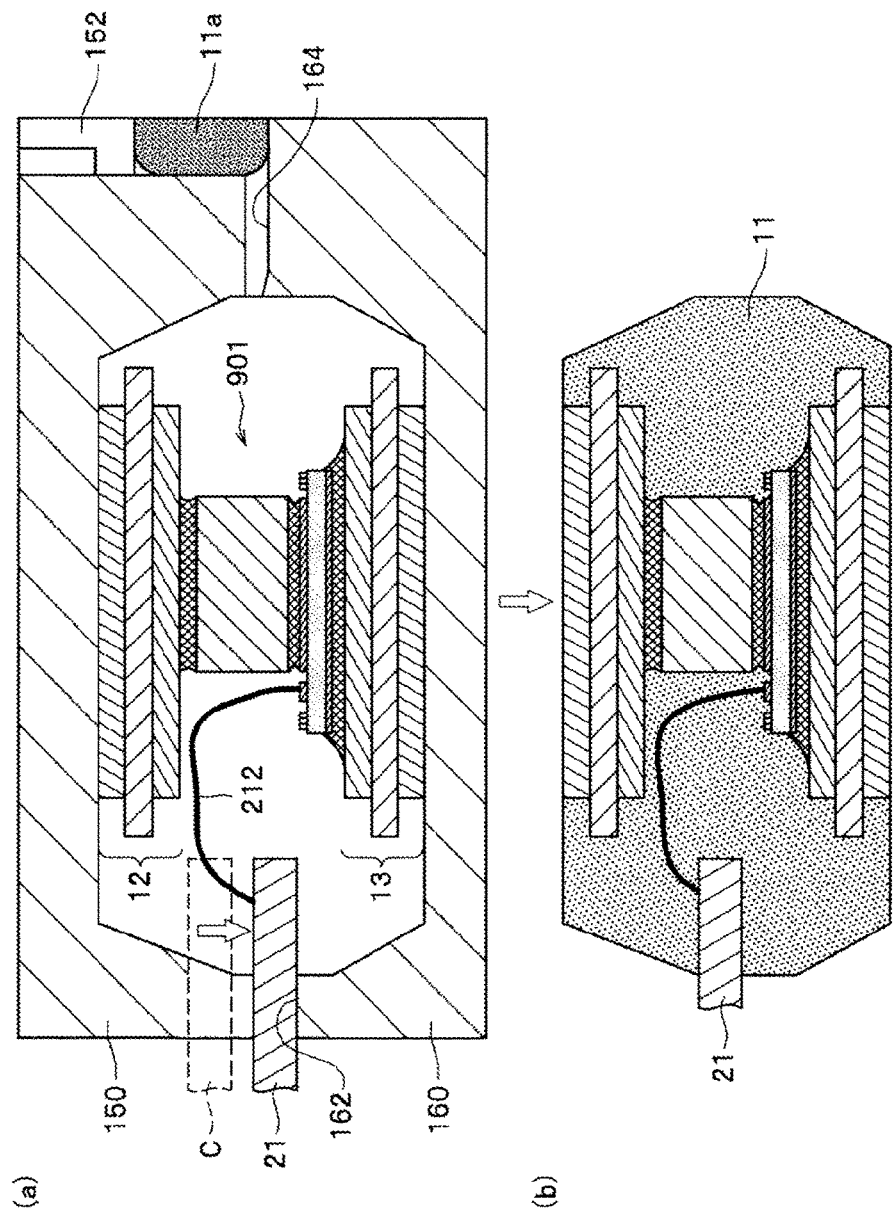
FIG. 8 is a diagram illustrating another manufacturing process of the power module.
Figure 9:
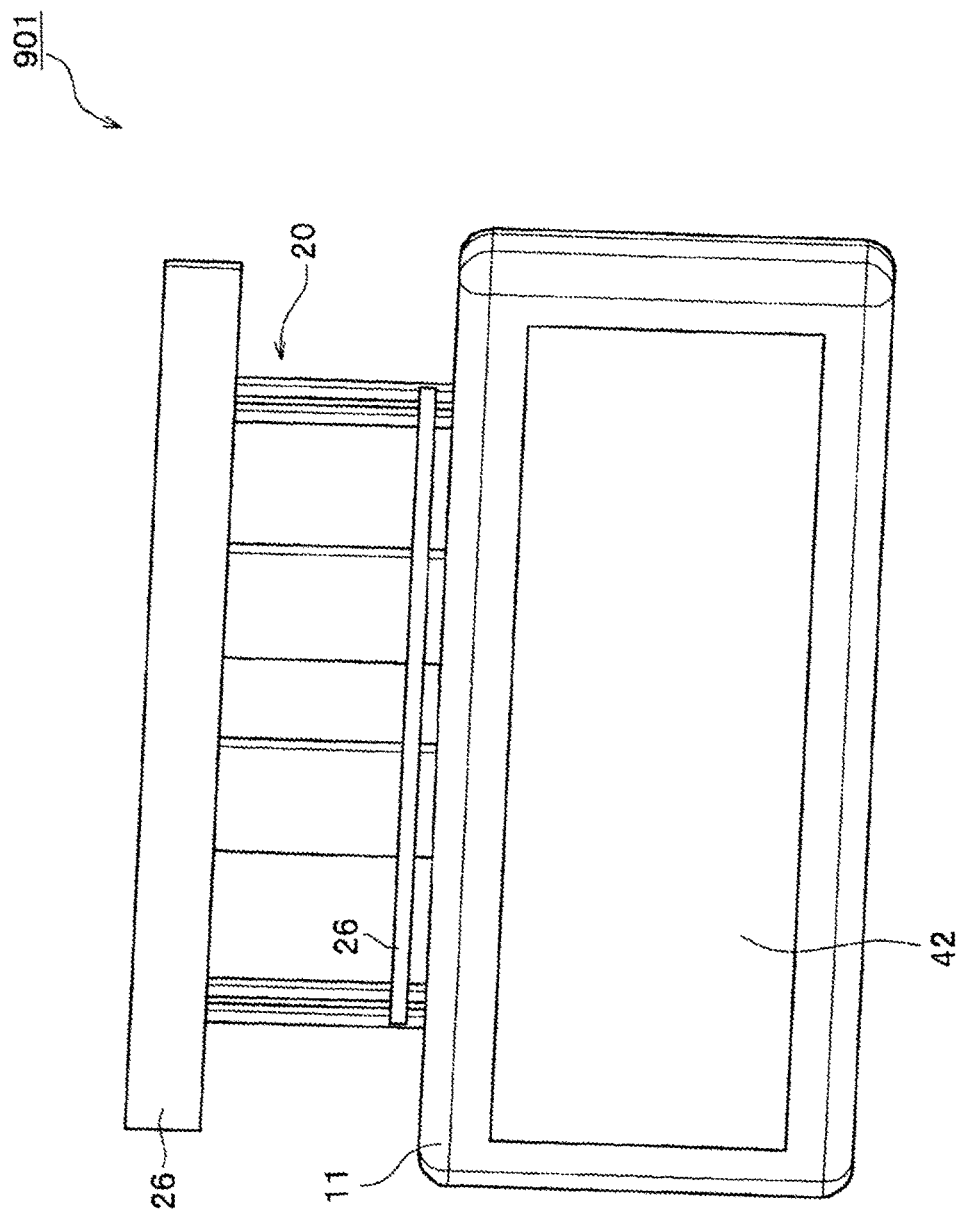
FIG. 9 is a diagram illustrating another manufacturing process of the power module.

(2) Further, in the manufacturing process illustrated in FIGS. 7 to 9, the ceramic substrate 12 comes into contact with the metal wire 212, and the metal wire 212 is deformed when the ceramic substrate 12 on the emitter electrode side is bonded after the metal wire 212 is connected (see FIG. 7 (c)). With this configuration, there is no need to consider a variation in loop height of the metal wire 212, and a margin to the thickness of the conductor block 202A can be reduced, so that the power module 901 can be made thinner.

The metal wire 212 coming into contact with the emitter circuit portion 202 moves downward using the movability of the gate terminal 21 in the process of FIG. 8(a) (setting to the molds 150 and 160), so that a slight gap can be formed between the emitter circuit portion 202 and the metal wire 212. Since a potential difference between the metal wire 212 and the emitter circuit portion 202 is about several volts at the time of using the power module 901, it is possible to secure a sufficient insulation distance even when a slight gap is formed.

(3) In addition, according to this embodiment, the pattern of the collector circuit portion 203 can be effectively simplified by separating the gate terminal 21 from the ceramic substrate 13 on the collector electrode side. For example, the pattern of the collector circuit portion 203 can be simplified until the pattern has the same shape as that of the ceramic insulating layer 303. The ceramic substrate 13 on the collector electrode side includes the collector circuit portion 203 made of metal having a large thermal expansion coefficient, and the ceramic insulating layer 303 having a small thermal expansion coefficient. Therefore, a stress may be easily focused on the end of the pattern of the collector circuit portion 203, and the ceramic insulating layer 303 may be easily cracked by the thermal stress caused by a temperature cycle. On the contrary, according to this embodiment, the pattern of the collector circuit portion 203 can be simplified, so that a region to cause the stress focusing becomes small. Therefore, it is possible to improve reliability.

(4) In addition, when the pattern of the collector circuit portion 203 is simplified, the shape of the ceramic insulating layer 303 itself can be simplified. Therefore, the ceramic substrates 12 and 13 on the collector and emitter sides can be manufactured to be substantially equal in structure, so that the costs can be effectively reduced through the commonalization.

(5) In addition, according to this embodiment, the respective terminals (the gate terminal 21, the emitter terminal 22, the collector terminal 23, and the sense emitter terminal 25) are lead out from the same surface of the power module 901 in the same direction. With such a shape, an external dimension of the power module 901 containing the respective terminals can be reduced. In addition, according to this embodiment, the terminals 22 and 23 are lead out from places facing the diode chips 110 (see FIG. 3). Since there is no control electrode (the gate electrode 101 of the IGBT chip 100) in the diode chip 110, the width between the terminals 22 and 23 can be secured wide, and the capacity of the power module 901 can be increased. In addition, the distance between the emitter terminal 22 and the collector terminal 23 can be also secured wide, and a high breakdown voltage of the power module 901 can be achieved.

[Modification]

The invention is not limited to the above embodiments, and various modifications can be made. The above embodiments are described in a clearly understandable way for the invention, and thus the invention is not necessarily to provide all the configurations described above. In addition, some configurations of a certain embodiment may be replaced with the configurations of another embodiment, and the configuration of the other embodiment may also be added to the configuration of a certain embodiment. Additions, omissions, and substitutions may be made on some configurations of each embodiment using other configurations. The possible modifications with respect to the embodiments are as follows for example.

(1) A configuration of a power module according to a modification of the embodiment will be described with reference to FIGS. 10(a) to 10(c). FIG. 10(a) illustrates the power module of this modification in which the sealing portion is excluded. This modification is different from the embodiment (FIG. 3) in that metal wires 213 and 253 are employed in place of the metal wires 212 and 252. As illustrated in FIG. 10(a), parts of the metal wires 213 and 253 are curved in a lateral direction (a layout direction of the terminals 21, 22, 23, and 25).

Herein, a perspective view of the metal wire 213 is illustrated in FIG. 10(b). The metal wire 213 has the loop shape as indicated by a broken line E at the time of bonding, and then curved in the lateral direction. In other words, the metal wire 213 is curved in the place near to the ceramic substrate 12 on the emitter electrode side in a projection shape with respect to the ceramic substrate 12 on the emitter electrode side. In order to realize such a curved shape, as illustrated in FIG. 10(c), the ceramic substrate 12 on the emitter electrode side may be disposed slightly inclined with respect to the layout direction of the terminals 21, 22, 23, and 25 so as to press the metal wires 213 and 253.

The metal wires 213 and 253 are curved in the same direction, so that the contact can be prevented even when the wires are adjacent to each other. Thereafter, the processes described in FIGS. 8(a), 8(b), and 9 are performed, and the metal wires 213 and 253 are configured not to come into contact with the ceramic substrate 12 at the time of transfer molding as described in the above embodiment. Even in this modification, the metal wires 213 and 253 can be disposed near to the ceramic substrate 12 while securing a sufficient insulation distance with respect to the member (such as the metal bonding portion 803 of FIG. 5) to be at the collector potential. Therefore, the power module can be configured to be thin and small as described in the above embodiment.

(2) In addition, the gate electrode 101 and the gate terminal 21 are connected by the metal wire 212 in the manufacturing process of the embodiment (FIG. 7 (b)), and then the conductor block 202A is bonded to the emitter electrode 102 (FIG. 7(c)). However, first the conductor block 202A is bonded to the emitter electrode 102, and then the gate electrode 101 and the gate terminal 21 may be connected by the metal wire 212.

(3) In the above embodiment, the gate terminal 21 has been drawn from the same surface and the same direction as those of the emitter terminal 22 and the collector terminal 23. The gate terminal 21 may be drawn from a surface different from that of the emitter terminal 22 and the collector terminal 23. In addition, in the above embodiment, the gate terminals 21 are independently provided with respect to two IGBT chips 100, or may share one terminal 21. In addition, the emitter terminal 22 and the collector terminal 23 may branch into plural pieces. In this case, when the emitter terminal and the collector terminal are alternately arranged, inductance can be lowered.

(4) In the above embodiment, an application of the IGBT chip 100 has been described as a specific example of the "semiconductor chip". However, the "semiconductor chip" is not limited to the IGBT chip 100, and a MOSFET, a thyristor, a gate turn-off thyristor, and a triac may be used. In addition, in the above embodiment, an example of the IGBT chip 100 equipped with the gate electrode 101 and the sense emitter electrode 104 has been described as the control electrode. The control electrode may be configured only by the gate electrode 101, or may be added with the electrode of thermistor.

REFERENCE SIGNS LIST 11 sealing portion (housing)
11a resin
12 ceramic substrate on emitter electrode side (first substrate)
12b end
13 ceramic substrate on collector electrode side (second substrate)
20 lead frame
21 gate terminal (control terminal)
21a connection point
22 emitter terminal (first terminal)
23 collector terminal (second terminal)
25 sense emitter terminal
26 runner
42, 43 heat radiating surface
100 IGBT chip (semiconductor chip)

101 gate electrode (control electrode)
102 emitter electrode (first electrode)
103 collector electrode (second electrode)
104 sense emitter electrode
110 diode chip
150, 160 mold
152 pressing portion
162 insertion hole
164 injection hole
202 emitter circuit portion (first conductive portion)
202A conductor block
203 collector circuit portion (second conductive portion)
212, 213, 252, 253 metal wire
302, 303 ceramic insulating layer
402, 403 heat radiating portion
801 to 803 metal bonding portion
901 power module

The invention claimed is:
1. A semiconductor module, comprising:
a first substrate;
a second substrate that is disposed to face the first substrate;
a first conductive portion that is provided on a side facing the second substrate in the first substrate;
a second conductive portion that is provided on a side facing the first substrate in the second substrate;
a first terminal that is bonded to the first conductive portion, and disposed between the first substrate and the second substrate;
a second terminal that is bonded to the second conductive portion, and disposed between the first substrate and the second substrate;
a control terminal that is disposed between the first substrate and the second substrate;
a semiconductor chip that includes a first electrode and a control electrode in one surface, and a second electrode in a surface opposite to the surface;
a metal wire that is drawn in an arc to connect the control terminal and the control electrode; and
a conductor block that is disposed between the first conductive portion and the second conductive portion,
wherein the semiconductor chip is configured such that the first electrode is connected to the first conductive portion of the first substrate through the conductor block, and the second electrode is connected to the second conductive portion of the second substrate,
wherein the metal wire rises to form a first angle from the control electrode toward the first conductive portion, gradually goes in substantially parallel to the first conductive portion as the metal wire approaches the first conductive portion, and is connected to the control terminal to form a second angle smaller than the first angle,
wherein the metal wire has a length exceeding "$L_1 + \sqrt{(L_2^2 + L_3^2)}$" where, $L_1$ is a distance between the first substrate and the control electrode in a direction perpendicular to the first conductive portion, $L_2$ is a distance between the first substrate and a connection point of the metal wire in the control terminal in a direction perpendicular to the first conductive portion, and $L_3$ is a distance between the control electrode and the connection point in a direction in parallel to the first conductive portion, and
wherein the metal wire has a place near to the first substrate with a distance equal to or less than 100 μm.
2. The semiconductor module according to claim 1, wherein the first substrate and the second substrate have the same shape and the same size.
3. The semiconductor module according to claim 1, wherein an end of the first conductive portion is formed in a straight shape in a surface where the control terminal is exposed from between the first substrate and the second substrate.
4. The semiconductor module according to claim 1, wherein an end of the first substrate is formed in a straight shape in a surface where the control terminal is exposed from between the first substrate and the second substrate.
5. The semiconductor module according to claim 1, wherein a shape of the metal wire projected to the first substrate is curved in a place near to the first conductive portion.
6. A method of manufacturing a semiconductor module that includes
a first substrate,
a second substrate that is disposed to face the first substrate,
a first conductive portion that is provided on a side facing the second substrate in the first substrate,
a second conductive portion that is provided on a side facing the first substrate in the second substrate,
a first terminal that is bonded to the first conductive portion, and disposed between the first substrate and the second substrate,
a second terminal that is bonded to the second conductive portion, and disposed between the first substrate and the second substrate,
a control terminal that is disposed between the first substrate and the second substrate,
a semiconductor chip that includes a first electrode and a control electrode in one surface, and a second electrode in a surface opposite to the surface,
a metal wire that is drawn in an arc to connect the control terminal and the control electrode, and
a conductor block that is disposed between the first conductive portion and the second conductive portion,
the method comprising:
bonding the second electrode to the second conductive portion of the second substrate;
bonding the conductor block to the first electrode of the semiconductor chip, and connecting the metal wire such that the control electrode and a bonding place of the control terminal by the metal wire interfere in a layout place of the first substrate;
bonding the first substrate to the conductor block while pressing the metal wire by the first substrate;
moving a position of the control terminal in a direction away from the first substrate to separate the metal wire from the first substrate; and
sealing a space between the first substrate and the second substrate by a transfer mold.

* * * * *